United States Patent [19]

Werrbach

[11] Patent Number: 4,578,648

[45] Date of Patent: Mar. 25, 1986

[54] DYNAMIC VERIFICATION GATE CIRCUIT

[76] Inventor: Donn R. Werrbach, 930 Kaheka St., Honolulu, Hi. 96814

[21] Appl. No.: 600,723

[22] Filed: Apr. 16, 1984

[51] Int. Cl.$^4$ .............................................. H03G 3/10
[52] U.S. Cl. ................................... 330/281; 330/141; 330/279
[58] Field of Search .................. 330/51, 129, 134, 141, 330/149, 279, 281

[56] References Cited

U.S. PATENT DOCUMENTS

| | | | |
|---|---|---|---|
| 3,488,604 | 1/1970 | Smilowitz | 330/279 |
| 4,371,842 | 2/1983 | Lee | 330/281 X |
| 4,471,317 | 9/1984 | Nilsson et al. | 330/141 |

*Primary Examiner*—Eugene R. LaRoche
*Assistant Examiner*—Steven J. Mottola

*Attorney, Agent, or Firm*—Irving M. Kriegsman

[57] ABSTRACT

A circuit for automatically controlling the operation of a variable gain control circuit in an audio signal processing system by verifying whether gain change is desirable and then gating the operation of the gain control circuit is disclosed. A pair of operational amplifiers along with a set of four diodes produce two equal absolute value signals representing a full wave rectified version of the audio input signal. A first filter circuit processes one of the absolute value signals to produce a third signal corresponding to average signal amplitude. A second filter circuit processes the other absolute value signal to produce a fourth signal corresponding to an average of peak values. A comparator compares the third and fourth signals and produces an output signal which is used as the control signal for controlling the variable gain control circuit.

7 Claims, 2 Drawing Figures

DYNAMIC VERIFICATION GATE CIRCUIT

BACKGROUND OF THE INVENTION

The present invention relates generally to gain control circuits wherein the amplification of an audio frequency signal is automatically controlled electronically and more particularly to a gate circuit which dynamically verifies whether gain change is desirable and then gates the operation of the gain control circuit accordingly.

The present invention is applicable to any form of electronic gain control circuit where the amplification of an audio frequency signal is automatically controlled through electronic means. Such circuits may be found in dynamic range compression systems, amplitude limiters, dynamic range expanders, signal gates, amplitude leveling systems, gain platform controllers and other such circuits.

Circuits which control to some extent gain control circuits in audio signal processing systems are known in the art and are usually referred to by the names "silence gate", "release gate", or "gain gate". Such circuits generally compare the program audio level to a fixed, or set, reference level, and open or close the discharge path of a capacitor in the gain determining portion of the automatic gain system.

The present invention, on the other hand, rather than looking at program audio and comparing it to a fixed reference level, compares two instantaneous dynamic characteristics within the program audio to determine a "yes"-"no" decision which is then used to allow charge, or discharge of the storage capacitor, or other medium, in the gain determining system.

SUMMARY OF THE INVENTION

A dynamic verification gate circuit for use in controlling the operations of a variable gain control circuit in a system for processing an audio signal constructed according to the teachings of the present invention includes input means for receiving said audio signal, first means coupled to said input means for generating a pair of equal, absolute value signals representing the "full-wave" rectified versions of said audio signal, second means for generating from one of said absolute value signals a first signal representing the average signal amplitude of said absolute value signal, third means for generating from the other of said absolute value signals a second signal representing the average peak value of said other absolute value signal, comparator means for comparing the first signal and the second signal and generating a third signal corresponding to the comparison of said first and second signals, and output means coupled to the output of said comparator means for outputting said output signal from said comparator.

Various objects and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE PREFERRED EMBODIMENT

The present invention is directed to a dynamic verification gate circuit for analyzing the program content of audio material, and providing a form of control over the attack and release activity of a variable gain control circuit. The variable gain control circuit, with which the dynamic verification gate circuit is used has its operation modified by the dynamic verification gate circuit such that gain change is allowed or disallowed according to the decision of the dynamic verification gate circuit.

One effect of the circuit of this invention when incorporated in an automatic gain control cirucit, is to create an intelligent attack and/or release rate modification over the natural tendency of the gain control circuit operated without the circuit. The modification thus created improves the sonic integrity of the controlled audio, and reduces the perceptibility of automatic gain control effects to the listener which are usually considered to be undesirable, such as effects commonly referred to as "pumping", "breathing", "swelling", "popping", etc.

Another effect of the circuit is to stop gain recovery, or gain swelling during brief intervals of silence in program audio, The circuit detects brief pauses and locks the gain of the variable gain system to its most recent instantaneous value just prior to the program lapse and then returns control to the variable gain system the instant valid program resumes as long as the pause is of short duration, that duration being dependent on factors of the program characteristics, but generally less than two seconds duration. If program silence persists past the short time interval determined by the circuit, then the circuit will automatically return control to the automatic gain control system, and allow gain to increase at the natural rate of the particular gain control circuit.

One significant difference between the circuit of this invention and the typical "silence gate" is that a silence gate retains control of the system gain for an indefinite period as long as the audio level remains below the set threshold while the circuit of this invention relaxes control after a brief interval of silence rather than retaining such control indefinitely.

Another significant difference between the circuit of this invention and silence gate systems is that the circuit of this invention produces an influence on the active characteristics of the gain control system, such as an influence on attack and release timing during dynamic program content, while the silence gate produces no such influence on the gain control system, and only serves the purpose of detecting silence, or low audio level. In fact, the circuit of this invention may be implemented in addition to a "silence gate" system in the same circuit.

Figure 1:
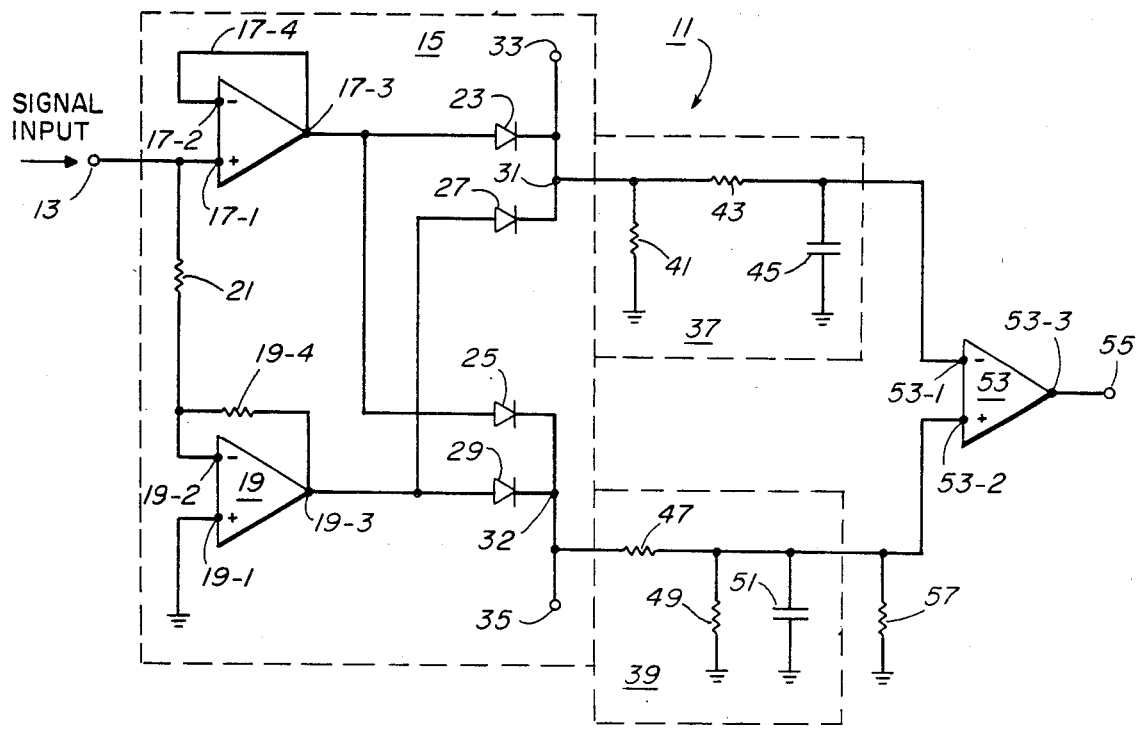
FIG. 1 is a diagram of a dynamic verification gate circuit constructed according to the teachings of the present invention.

Referring now to the drawings, there is illustrated in FIG. 1 a diagram of a dynamic verification gate circuit constructed according to the teachings of the present invention and identified generally by reference numeral 11.

Circuit 11 includes an input terminal 13 which receives the audio signal to be processed.

Circuit 11 further includes a rectifying section 15 which produces from the input signal received at input terminal 13 two equal, absolute value signals representing "full-wave" rectified versions of the input signal.

Rectifying section 15 includes a pair of operational amplifiers 17 and 19. Operational amplifier 17 has a positive input 17-1 which is coupled to input terminal 13, a negative input terminal 17-2 and an output terminal 17-3 which is coupled in feedback to the negative input terminal 17-2 over a line 17-4. Operational amplifier 19 includes a positive input terminal 19-1 which is coupled to ground, a negative input terminal 19-2 and an output terminal 19-3 which is coupled to negative input terminal 19-2 in feedback through a resistor 19-4. The input signal at input terminal 13 is also applied to operational amplifier 19 through a resistor 21. The output 17-3 of operational amplifier 17 is coupled to a first diode 23 and a second diode 25. The output terminal 19-2 of operational amplifier 19 is coupled to a third diode 27 and a fourth diode 29. The outputs of diodes 23 and 27 are coupled together at junction 31 and the outputs of diodes 25 and 29 are coupled together at junction 32. The signal at junction 29 may be measured at test point 33 and the signal at junction 32 may be measured at test point 35.

The signal at junction 29 is applied to an average signal amplitude producing section 37 and the signal at junction 32 is applied to an average peak value producing section 39. In the embodiment shown, sections 37 and 39 are implemented in the form of filter circuits.

Average signal amplitude producing section includes a pair of resistors 41 and 43 and a capacitor 45 which form an integrator with a relatively long time constant producing a representation of the average signal amplitude of the applied signal. Resistor 41 and capacitor 45 are coupled at one end to ground. The primary purpose of the "slow" integrator is to produce a representation of the approximate average power level of the audio wave averaged over time.

Average peak value producing section 39 includes a pair of resistors 47 and 49 and a capacitor 51 which form a filter which produces an average of peak values with a relatively short time constant compared to the integrator of average signal amplitude producing section 37. Resistor 49 and capacitor 51 are coupled at one end to ground. The primary purpose of the "fast" filter is to produce a representation of the average peak amplitude of the sampled audio wave averaged over a shorter time (than the time of the "slow" filter).

The output of average signal amplitude producing section 37 is applied to the negative input 53-1 of a comparator 53 and the output of average peak value producing section 39 is applied to the position input 53-2 of comparator 53.

In comparator 53 the average amplitude value from section 37 is compared to the average peak level value from seciton 39. When the average peak value is greater than the average signal amplitude, as during normal signal conditions, the comparator output at 53-3 goes high. Output terminal 53-3 is coupled to terminal 55 which is the output terminal of the circuit.

A resistor 57 is connected between the output of section 39 and input terminal 53-2 to establish a quiescent bias of comparator 53 to produce a "high" output under no signal conditions after the two filters have had time to discharge to zero volts. This produces the effect of forcing circuit 11 to relinquish control of the gain control system to which it is coupled after the interval of silence has extended past a desired time limit.

When the average peak value falls below the average signal amplitude value, as during pauses, the comparator output goes low.

It is to be understood that the circuit of the present invention may be implemented digitally as well as by analog techniques. If the circuit is implemented digitally numerical calculations may be utilized to obtain the required transformations, in which cause "time constants" do not necessarily apply. Therefore, invention is not intended to be limited in terms of strict time intervals, filter responses, or other such restricting factors.

Implementation of the dynamic verification gate circuit into various gain controlling circuits is accomplished through a variety of possible methods. One technique is to place a switching device such as a field effect transistor, in the level detector side-chain of the gain controlling circuit so that the storage capacitor is connected and disconnected from the level detector, and thus transformed into a "follow-and-hold" capacitor which is allowed to "follow" when the average peak value is greater than the average amplitude value, and caused to "hold" when the average peak value falls below the average amplitude value of the audio signal.

Figure 2:
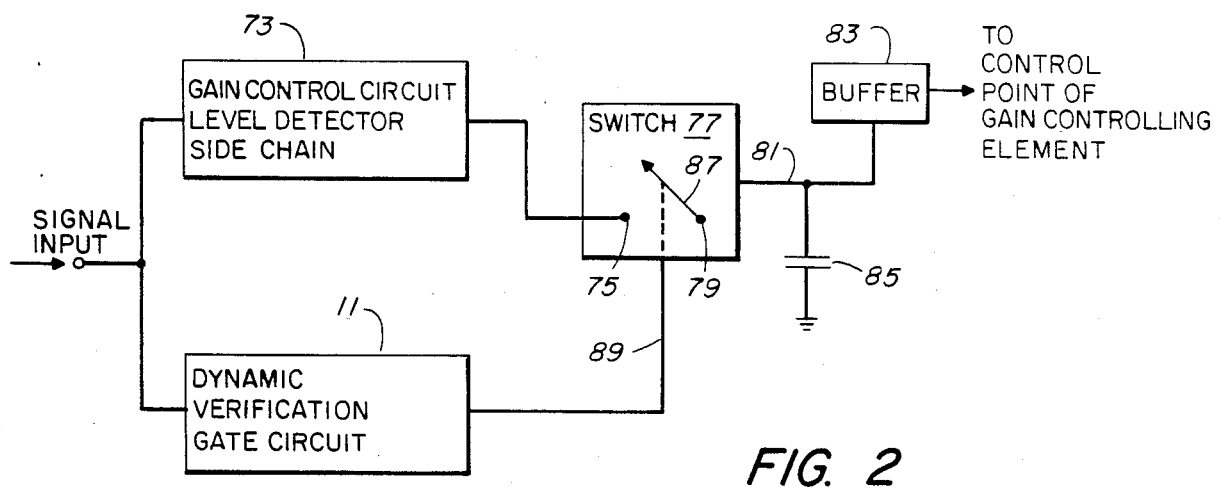
FIG. 2 is a diagram illustrating how the dynamic verification gate circuit of the invention may be used in a gain control circuit of an audio signal processing system.

A system illustrating this is shown in FIG. 2 and identified by reference numeral 71.

A level detector side chain 73 in a gain control circuit has its output coupled to one contact 75 in a switch 77. The other pin 79 in switch 77 is coupled through a line 81 to a buffer 83 whose output is applied to the control point of a gain controlling element in the gain control circuit. A capacitor 85 is coupled at one end to line 81 and coupled to ground at the other end. Arm 87 in switch 77 is controlled by a signal received over line 89 from dynamic verification gate 11.

In a digital implementation of the invention, either the circuit can be realized through digital computation or the "follow-and-hole" technique can be incorporated in a digital domain audio processor, or both can be the case. The invention therefor is clearly not limited to analog circuitry.

Some of the important advantages of the invention are summarized below:

a. Eliminates noise swelling
b. Eliminates breath exaggeration in dialog when compressed,
c. Eliminates "punch-out" of transient sounds in limiters,
d. Preserves timbre and equalization of program audio which is normally unfavorably modified through compression and limiting,
e. Greatly reduces harmonic distortion due to voltage control ripple in compression amplifiers,
f. Reduces gain-intermodulation distortion effects found in limiters and compressors,
g. Psychoacoustically more natural program quality is preserved due to reduced gain slewing.
h. reduced over-compression, or over-limiting caused by gain slewing overshoot which is reduced.

The embodiment of the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A dynamic verification gate circuit for use in controlling the operation of a variable gain control circuit in a system for processing an audio signal, said dynamic verification gate circuit comprising:
    a. input means for receiving said audio signal,
    b. first means coupled to said input means for generating a pair of equal, absolute value signals representing the "full-wave" rectified versions of said audio signal,
    c. second means for generating from one of said absolute value signals a first signal representing the average signal amplitude of said absolute value signal,
    d. third means for generating from the other of said absolute value signals a second signal representing the average peak value of said other absolute value signal,
    e. comparator means for comparing the first signal and the second signal and generating a third signal corresponding to the comparison of said first and second signals, and
    f. output means coupled to the output of said comparator means for outputting said output signal from said comparator.

2. The dynamic verification gate of claim 1 and further including biasing means for biasing the comparator means.

3. The dynamic verification gate of claim 2 and wherein said second means comprises a first filter, said first filter comprising a first resistor, a second resistor and a capacitor.

4. The dynamic verification gate of claim 3 and wherein said third means comprises a second filter, said second filter comprising a first resistor, a capacitor and a second resistor.

5. The dynamic verification gate of claim 4 and wherein said first means comprises a first operational amplifier, a second operational amplifier and a set of four diodes.

6. A dynamic verification gate circuit for use in controlling the operation of a variable gain control circuit in a system for processing an audio signal, said dynamic verification gate circuit comprising:
    a. input means for receiving said audio signal,
    b. first means coupled to said input means for generating a first signal representing the average signal amplitude of said audio signal,
    c. second means coupled to said input means for generating a second signal representing the average peak amplitude of said audio signal,
    d. comparator means for comparing the first signal and the second signal and generating a third signal corresponding to the comparison of said first and second signals, and
    e. output means coupled to said comparator means for outputting said output signal from said comparator.

7. In a system for processing an audio signal which includes a gain control circuit having a level detector side chain whose output is adapted to be applied to the control point of a gain controlling element in said gain control circuit, the combination comprising:
    a. a buffer having an input and an output and coupled at said output to said control point,
    b. a switch coupled between said level detector side chain and the input of said buffer, and
    c. a dynamic verification gate circuit for controlling said switch, said dynamic verification gate circuit comprising:
        i. input means for receiving said audio signal,
        ii. first means coupled to said input means for generating a pair of equal, absolute value signals representing the "full-wave" rectified versions of said audio signal,
        iii. a second means for generating from one of said absolute value signals a first signal representing the average signal amplitude of said absolute value signal,
        iv. third means for generating from the other of said absolute value signals a second signal representing the average peak value of said other absolute value signal,
        v. comparator means for comparing the first signal and the second signal and generating a third signal corresponding to the comparison of said first and second signals, and
        vi. output means coupled to the output of said comparator means for outputting said output signal from said comparator.

* * * * *